US006778626B2

United States Patent
Yu

(10) Patent No.: US 6,778,626 B2
(45) Date of Patent: Aug. 17, 2004

(54) BI-DIRECTIONAL SHIFT-REGISTER CIRCUIT

(75) Inventor: Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/406,026

(22) Filed: Apr. 2, 2003

(65) Prior Publication Data

US 2004/0052327 A1 Mar. 18, 2004

(51) Int. Cl.$^7$ .............................................. G11C 19/00
(52) U.S. Cl. .............................. 377/69; 377/70; 377/79
(58) Field of Search .............................. 377/69, 70, 79

(56) References Cited

U.S. PATENT DOCUMENTS

| | | | | |
|---|---|---|---|---|
| 5,717,351 A | * | 2/1998 | Katsutani | 327/108 |
| 5,859,630 A | * | 1/1999 | Huq | 345/100 |
| 6,678,315 B1 | * | 1/2004 | Hikita et al. | 375/222 |

\* cited by examiner

Primary Examiner—Margaret Wambach
(74) Attorney, Agent, or Firm—Ladas & Parry

(57) ABSTRACT

A bi-directional shift-register circuit for outputting data in different turns according to a switching signal. Each shift-register unit includes a first input terminal, a second input terminal, an output terminal and a clock input terminal for receiving the clock signal. The first switching circuit is coupled to the output terminal of the pre-stage shift-register unit, the output terminal of the next-stage shift-register unit and the switching signal, and outputs the signal of the output terminal of the pre-stage shift-register unit to the first input terminal of the present-stage shift-register unit and outputs the signal of the output terminal of the next-stage shift-register unit to the second input terminal of the present-stage shift-register unit when the switching signal is at a first voltage level, and outputs the signal of the output terminal of the next-stage shift-register unit to the first input terminal of the present-stage shift-register unit and outputs the signal of the output terminal of the pre-stage shift-register unit to the second input terminal of the present-stage shift-register unit when the switching signal is at a second voltage level.

19 Claims, 6 Drawing Sheets

BI-DIRECTIONAL SHIFT-REGISTER CIRCUIT

BACKGROUND OF THE INVENTION

1. Field of the Invention

The present invention relates in general to a shift-register circuit. In particular, the present invention relates to a bi-directional shift-register circuit for driving a liquid crystal display.

2. Description of the Related Art

A frame of a liquid crystal display (LCD) is generated by a plurality of pixels of the matrices. Thus, sequential pulses are basic signals driving the LCD. In addition, the sequential pulses are generated by shift-register circuit, so the shift register circuit becomes a general unit for the driving circuit of LCD.

FIG. 1 shows a conventional shift-register circuit Only three stages of shift-register units are shown in FIG. 1 and a plurality of shift-register units comprise a shift-register circuit. The input signals of the (N−1)th-stage shift-register unit 100 are the output signal (N−2)OUT of the (N−2)th-stage shift-register unit and the output signal (N)OUT of the (N)th-stage shift-register unit 102. The input signals of the (N)th-stage shift-register unit 102 are the output signal (N−1)OUT of the (N−1)th-stage shift-register unit 100 and the output signal (N+1)OUT of the (N+1)th-stage shift-register unit 104. The input signals of the (N+1)th-stage shift-register unit 104 are the output signal (N)OUT of the (N)th-stage shift-register unit 102 and the output signal (N+2)OUT of the (N+2)th-stage shift-register unit. In addition, the adjacent shift-register units receive inverted clock signals (CLK or $\overline{\text{CLK}}$). Accordingly, each shift-register unit operates according to the output signal of the pre-stage shift-register unit and the next-stage shift-register unit and outputs data according to the voltage level of the clock signal.

FIG. 2 shows a timing chart of the conventional shift-register unit. The output of the shift-register unit 100 is labeled (N−1)OUT, the output of the shift-register unit 102 is labeled (N)OUT and the output of the shift-register unit 104 is labeled (N+1)OUT. The data output from each shift-register units is delayed by a half clock period. Thus, the requirement of the shift-register circuit is achieved.

However, single scanning turn is not satisfied by the entire requirement of the LCD products. For example, some display types of digital camera are rotated according to the placement angle of the camera. In addition, some LCD monitors comprise the function of rotating the monitor, so LCD display with different scanning turns is required. Therefore, the shift-register circuit with different signal outputting turn is also required.

SUMMARY OF THE INVENTION

The object of the present invention is thus to provide a bi-directional shift-register circuit outputting data in multi-direction turns.

To achieve the above-mentioned object, the present invention provides a bi-directional shift-register circuit for outputting data in different turns according to a clock signal, an inverted clock signal and a switching signal. The first shift-register unit includes a first-stage first input terminal, a first-stage second input terminal, a first-stage output terminal and a first-stage clock input terminal for receiving the clock signal. The second shift-register unit includes a second-stage first input terminal, a second-stage second input terminal, a second-stage output terminal and a second-stage clock input terminal for receiving the inverted clock signal. The third shift-register unit includes a third-stage first input terminal, a third-stage second input terminal, a third-stage output terminal and a third-stage clock input terminal for receiving the clock signal. The first switching circuit is coupled to the first-stage output terminal, the third-stage output terminal and the switching signal and outputs the signal of the first-stage output terminal to the second-stage first input terminal and outputs the signal of the third-stage output terminal to the second-stage second input terminal when the switching signal is at a first voltage level, and outputs the signal of the third-stage output terminal to the second-stage first input terminal and outputs the signal of the first-stage output terminal to the second-stage second input terminal when the switching signal is at a second voltage level.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
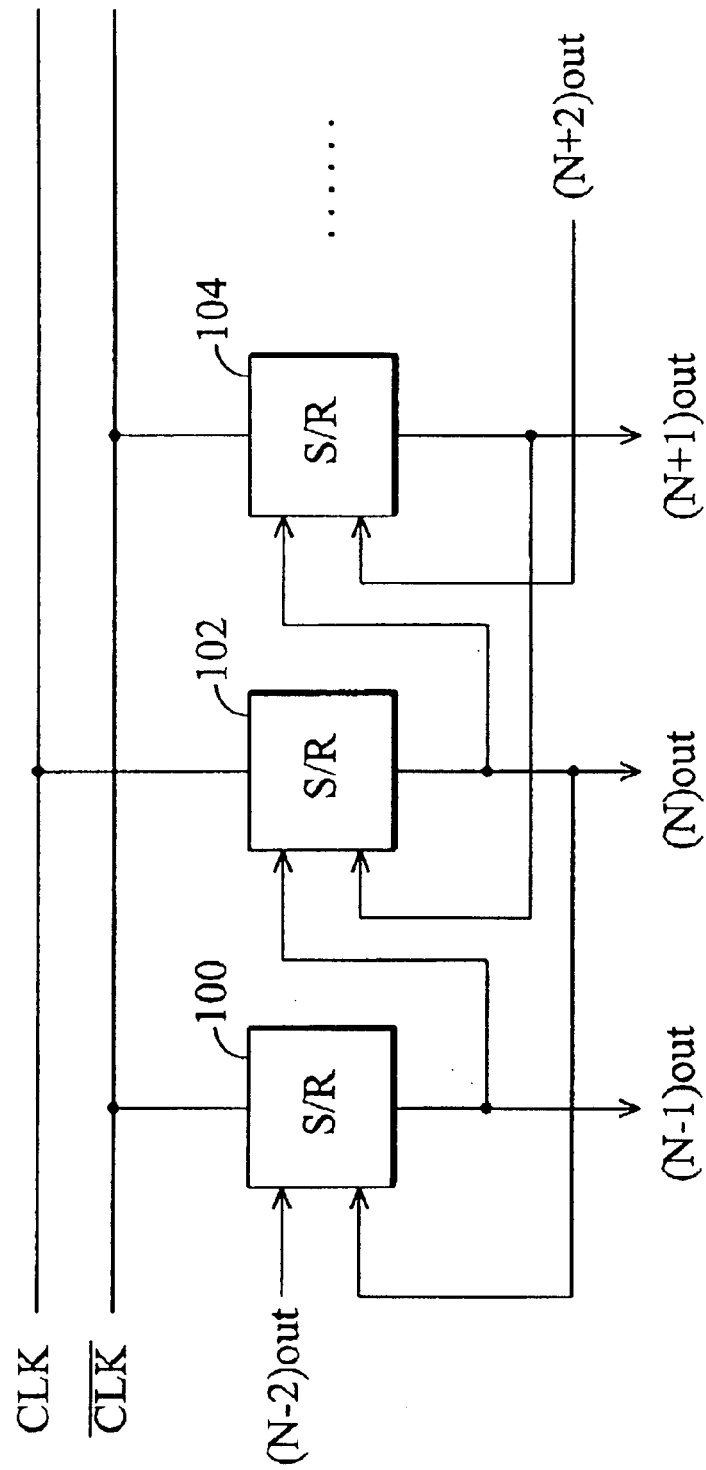
FIG. 1 shows a conventional shift-register circuit of LCD.
Figure 2:
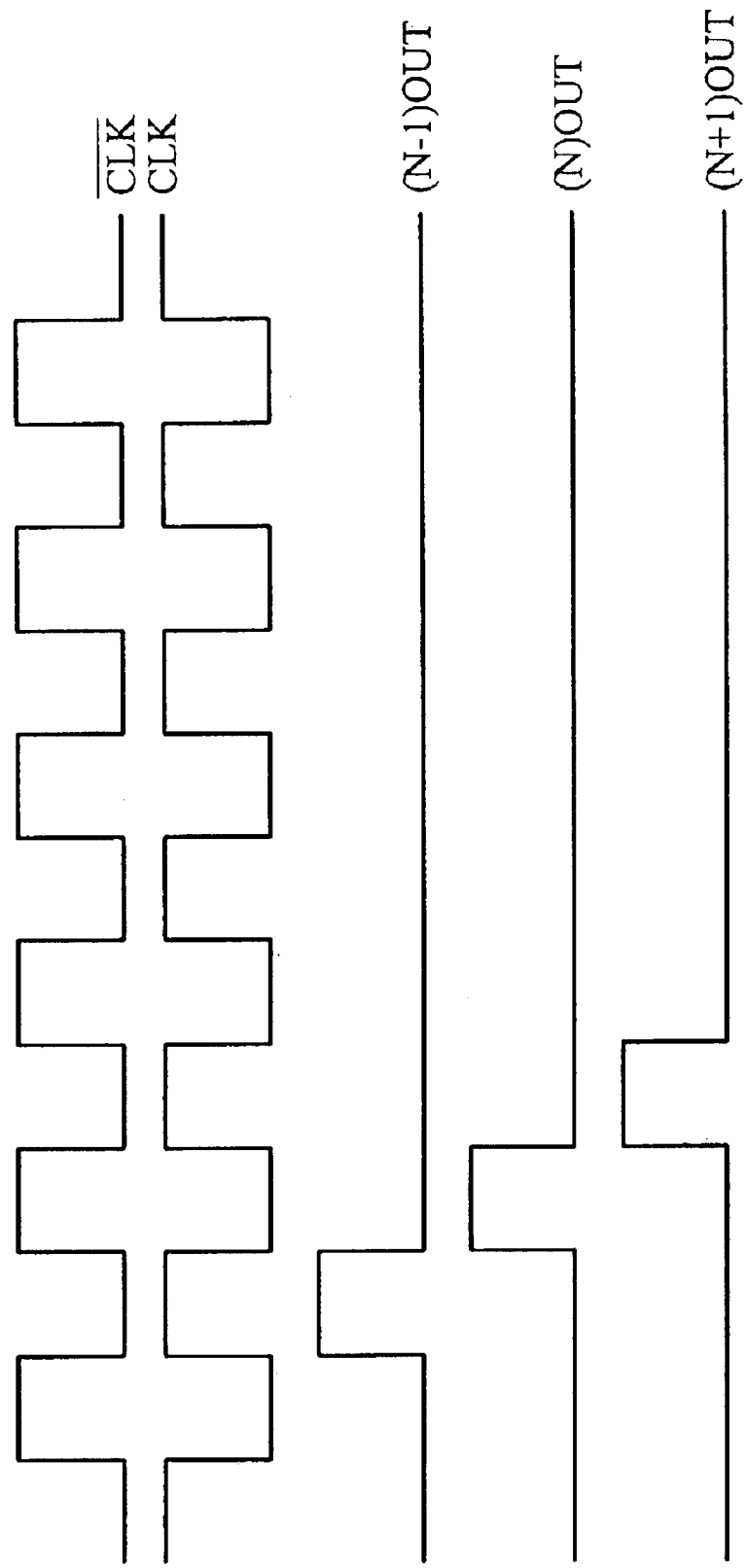
FIG. 2 shows a timing chart of the output of the conventional shift-register circuit.
Figure 3:
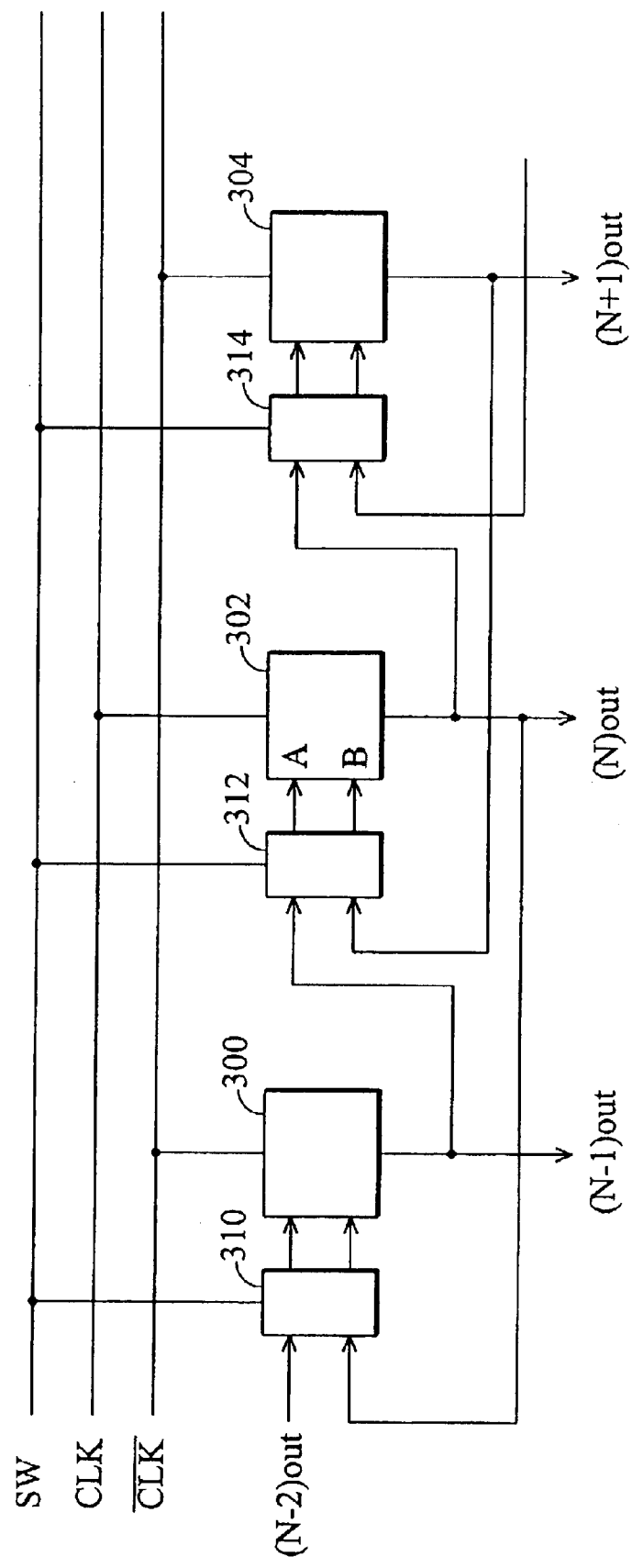
FIG. 3 shows a circuit of the bi-directional shift-register circuit according to the embodiment of the present invention.

FIG. 3 shows a circuit of the bi-directional shift-register circuit according to the embodiment of the present invention. Only three stages of shift-register units are shown in FIG. 3, and a plurality of shift-register units comprise a shift-register circuit. In the present invention, each shift-register unit has a switching circuit added to switch the data output turns of the shift-register units.

In FIG. 3, the input signals of the (N−1)th-stage shift-register unit 300 are the output signal (N−2)OUT of the (N−2)th-stage shift-register unit and the output signal (N)OUT of the (N)th-stage shift-register unit 302 output by the switching circuit 310. The input signals of the (N)th-stage shift-register unit 302 are the output signal (N−1)OUT of the (N−1)th-stage shift-register unit 300 and the output signal (N+1)OUT of the (N+1)th-stage shift-register unit 304 output by the switching circuit 312. The input signals of the (N+1)th-stage shift-register unit 304 are the output signal (N)OUT of the (N)th-stage shift-register unit 302 and the output signal (N+2)OUT of the (N+2)th-stage shift-register unit output by the switching circuit 314.

In addition, the adjacent shift-register units receive inverted clock signals (CLK or $\overline{\text{CLK}}$). Moreover, each shift-register unit comprises a clock input terminal and two data input terminals. The signals received by the two data input terminals determine the start and end of signal output of the shift-register unit. For example, the (N)th-stage shift-register unit 302 receives the output signal (N−1)OUT of the (N−1)th-stage shift-register unit 300 and the output signal (N+1)OUT of the (N+1)th-stage shift-register unit 304 through the switching circuit 312. The shift-register circuit outputs signal in the turns of the (N−1)th-stage shift-register unit, the (N)th-stage shift-register unit and the (N+1)th-stage shift-register unit when the data input terminal A receives the output signal (N−1)OUT of the (N−1)th-stage shift-register unit and the data input terminal B receives the output signal (N+1)OUT of the (N+1)th-stage shift-register unit. Contrarily, the shift-register circuit outputs signal in the turns of the (N+1)th-stage shift-register unit, the (N)th-stage shift-register unit and the (N−1)th-stage shift-register unit when the data input terminal A receives the output signal (N+1) OUT of the (N+1)th-stage shift-register unit and the data input terminal B receives the output signal (N−1)OUT of the (N−1)th-stage shift-register unit.

Figure 4:
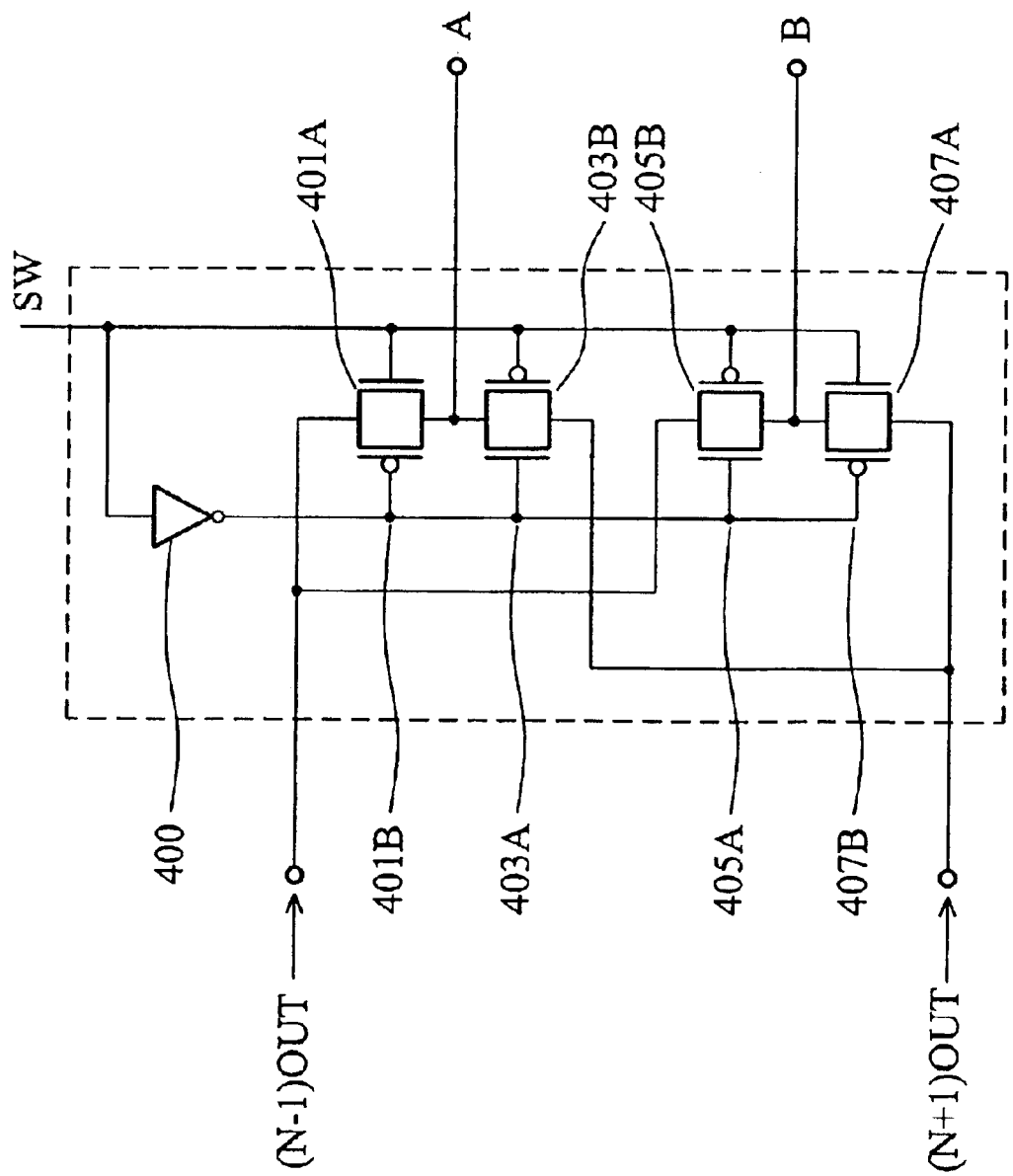
FIG. 4 shows a switching circuit according to the embodiment of the present invention.

The switching circuit selectively provides data to the data input terminals of the shift-register unit according to the voltage level of the switching signal SW. FIG. 4 shows a switching circuit according to the embodiment of the present invention. The switching circuit 312 is described, and the other switching circuit comprises the same circuit except for the received signals. The switching circuit comprises a plurality of transmission gates and an inverter. The transmission gate comprises a PMOS transistor and an NMOS transistor whose sources and drains are connected.

The inverter 400 inverts the switching signal SW. The source and the drain of the NMOS transistor 401A are connected to the drain and the source of the PMOS transistor 401B. In addition, the gate of the NMOS transistor 401A is connected to the switching signal SW, the drain of the NMOS transistor 401A is connected to the output signal (N−1)OUT of the (N−1)th stage shift-register unit 300, and the source of the NMOS transistor 401A is connected to the input terminal A of the (N)th stage shift-register unit 302. In addition, the gate of the PMOS transistor 401B is connected to the inverted switching signal output from the inverter 400. Moreover, the source and the drain of the NMOS transistor 403A are connected to the drain and the source of the PMOS transistor 403B. In addition, the gate of the PMOS transistor 403B is connected to the switching signal SW, the source of the PMOS transistor 403B is connected to the output signal (N+1)OUT of the (N+1)th stage shift-register unit 304, and the drain of the PMOS transistor 403B is connected to the input terminal A of the (N)th stage shift-register unit 302. In addition, the gate of the NMOS transistor 403A is connected to the inverted switching signal output from the inverter 400. Moreover, the source and the drain of the NMOS transistor 405A are connected to the drain and the source of the PMOS transistor 405B. In addition, the gate of the PMOS transistor 405B is connected to the switching signal SW, the source of the PMOS transistor 405B is connected to the output signal (N−1)OUT of the (N−1)th stage shift-register unit 300, and the drain of the PMOS transistor 405B is connected to the input terminal B of the (N)th stage shift-register unit 302. In addition, the gate of the NMOS transistor 405A is connected to the inverted switching signal output from the inverter 400. Moreover, the source and the drain of the NMOS transistor 407A are connected to the drain and the source of the PMOS transistor 407B. In addition, the gate of the NMOS transistor 407A is connected to the switching signal SW, the source of the NMOS transistor 407A is connected to the input terminal B of the (N)th stage shift-register unit 302, and the drain of the NMOS transistor 401A is connected to the output signal (N+1)OUT of the (N+1)th stage shift-register unit 304. In addition, the gate of the PMOS transistor 403B is connected to the inverted switching signal output from the inverter 400.

In addition, the clock signals received by the bi-directional shift-register circuit can be single clock or a pair of complementary clock signals. The switching signals can be a pair of complementary signals. Thus, the inverter 400 can be removed.

The operation of the switching circuit according to the present invention is described. When the switching signal SW is at high voltage level, the NMOS transistors 401A and 407A and the PMOS transistors 401B and 407B are turned on. Thus, the output signal (N−1)OUT of the (N−1)th stage shift-register unit 300 and the output signal (N+1)OUT of the (N+1)th stage shift-register unit 304 are input to the input terminals A and B of the (N)th stage shift-register unit 302, respectively. When the switching signal SW is at low voltage level, the NMOS transistors 403A and 403A and the PMOS transistors 403B and 403B are turned on. Thus, the output signal (N−1)OUT of the (N−1)th stage shift-register unit 300 and the output signal (N+1)OUT of the (N+1)th stage shift-register unit 304 are input to the input terminals B and A of the (N)th stage shift-register unit 302, respectively.

Figure 5A:
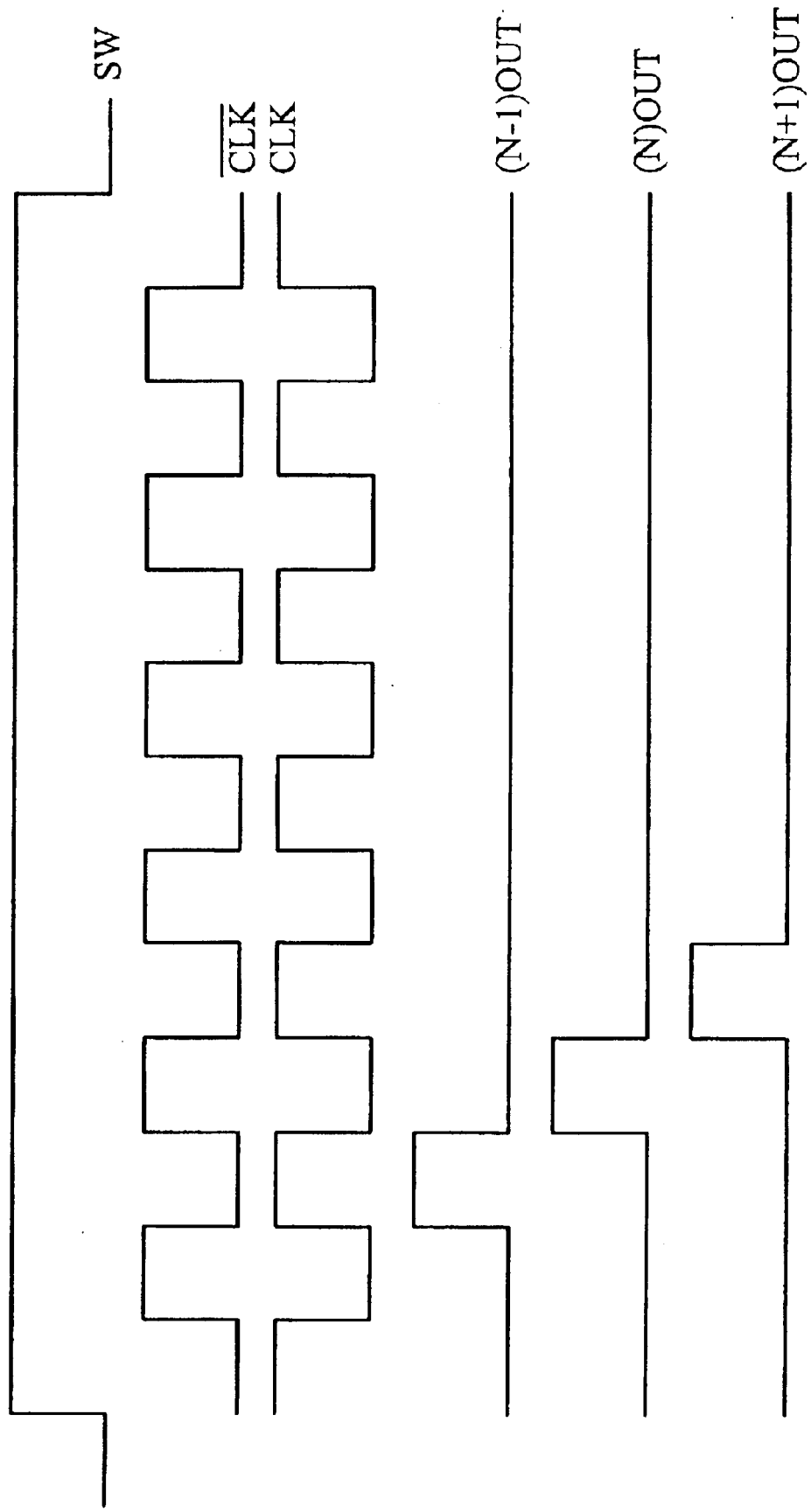
FIGS. 5A and 5B are timing charts of the output of the bi-directional shift-register circuit according to the embodiment of the present invention.
Figure 5B:
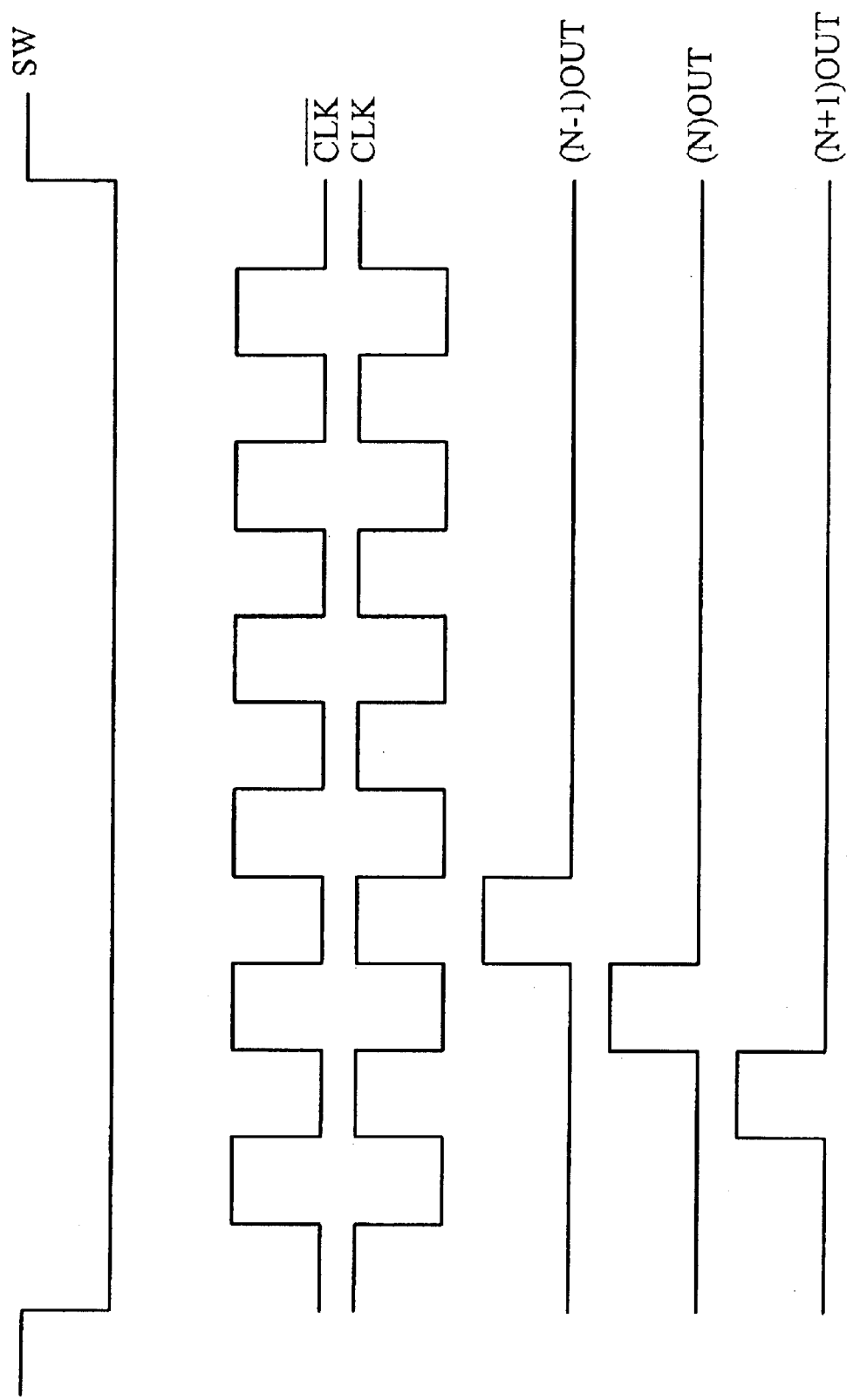

FIGS. 5A and 5B are timing charts of the bi-directional shift-register circuit according to the embodiment of the present invention in different directions. The output of the shift-register unit 300 is labeled (N−1)OUT, the output of the shift-register unit 302 is labeled (N)OUT and the output of the shift-register unit 304 is labeled (N+1)OUT. As shown in FIG. 3, each shift-register unit of the shift-register circuit according to the embodiment of the present invention outputs a pulse after the previous stage shift-register unit outputs a pulse in a half clock period and the signal output turns are depend on the voltage level of the switching signal. Thus, the requirement of the shift-register circuit is achieved, and the requirement of the shift-register circuit output signals in different turns is also achieved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bi-directional shift-register circuit comprising thin film transistors for outputting data in different turns according to a clock signal, an inverted clock signal and a switching signal, comprising:

a first shift-register unit having a first-stage first input terminal, a first-stage second input terminal, a first-stage output terminal and a first-stage clock input terminal for receiving the clock signal;

a second shift-register unit having a second-stage first input terminal, a second-stage second input terminal, a second-stage output terminal and a second-stage clock input terminal for receiving the inverted clock signal;

a third shift-register unit having a third-stage first input terminal, a third-stage second input terminal, a third-stage output terminal and a third-stage clock input terminal for receiving the clock signal; and a first switching circuit coupled to the first-stage output terminal, the third-stage output terminal and the switching signal, outputting the signal of the first-stage output terminal to the second-stage first input terminal and outputting the signal of the third-stage output terminal to the second-stage second input terminal when the switching signal is at a first voltage level and outputting the signal of the third-stage output terminal to the second-stage first input terminal and outputting the signal of the first-stage output terminal to the second-stage second input terminal when the switching signal is at a second voltage level.

2. The bi-directional shift-register circuit as claimed in claim 1, wherein the data is sequentially output by the first shift-register unit, the second shift-register unit and the third shift-register unit when the switching signal is at the first voltage level.

3. The bi-directional shift-register circuit as claimed in claim 2, wherein the data is sequentially output by the third shift-register unit, the second shift-register unit and the first shift-register unit when the switching signal is at the second voltage level.

4. The bi-directional shift-register circuit as claimed in claim 1, further comprising a second switching circuit for selective output of the signal output from the second-stage output terminal to the third-stage first input terminal or third-stage second input terminal.

5. The bi-directional shift-register circuit as claimed in claim 1, wherein the first switching circuit comprises:

a first transmission gate and a second transmission gate coupled to the first-stage output terminal and the third-stage output terminal and outputting the signal output from the first-stage output terminal to the second-stage first input terminal when the switching signal is at the first level; and a third transmission gate and a fourth transmission gate coupled to the first-stage output terminal and the third-stage output terminal and outputting the signal output from the third-stage output terminal to the second-stage second input terminal when the switching signal is at the first level.

6. The bi-directional shift-register circuit as claimed in claim 5, wherein the first transmission gate and the second transmission gate output the signal output from the third-stage output terminal to the second-stage first input terminal and the third transmission gate and the fourth transmission gate output the signal output from the first-stage output terminal to the second-stage second input terminal when the switching signal is at the second voltage level.

7. The bi-directional shift-register circuit as claimed in claim 5, wherein the first transmission gate, the second transmission gate, the third transmission gate and the fourth transmission gate comprise a PMOS thin film transistor and a NMOS thin film transistor, respectively.

8. The bi-directional shift-register circuit as claimed in claim 7, wherein the switching signal is coupled to the gates of the NMOS thin film transistors of the first transmission gate and the fourth transmission gate and the gates of the PMOS thin film transistors of the second transmission gate and the third transmission gate.

9. The bi-directional shift-register circuit as claimed in claim 7, further comprising an inverter for inverting the switching signal.

10. The bi-directional shift-register circuit as claimed in claim 9, wherein the inverted switching signal is coupled to the gates of the PMOS thin film transistors of the first transmission gate and the fourth transmission gate and the gates of the NMOS thin film transistors of the second transmission gate and the third transmission gate.

11. A bi-directional shift-register circuit for outputting data in different turns according to a clock signal, an inverted clock signal, a switching signal and an inverted switching signal, comprising:

a first shift-register unit having a first-stage first input terminal, a first-stage second input terminal, a first-stage output terminal and a first-stage clock input terminal for receiving the clock signal;

a second shift-register unit having a second-stage first input terminal, a second-stage second input terminal, a second-stage output terminal and a second-stage clock input terminal for receiving the inverted clock signal;

a third shift-register unit having a third-stage first input terminal, a third-stage second input terminal, a third-stage output terminal and a third-stage clock input terminal for receiving the clock signal; and a first switching circuit coupled to the first-stage output terminal, the third-stage output terminal and the switching signal, outputting the signal of the first-stage output terminal to the second-stage first input terminal and outputting the signal of the third-stage output terminal to the second-stage second input terminal when the switching signal is at a first voltage level and outputting the signal of the third-stage output terminal to the second-stage first input terminal and outputting the signal of the first-stage output terminal to the second-stage second input terminal when the switching signal is at a second voltage level.

12. The bi-directional shift-register circuit as claimed in claim 11, wherein the data is sequentially output by the first shift-register unit, the second shift-register unit and the third shift-register unit when the switching signal is at the first voltage level.

13. The bi-directional shift-register circuit as claimed in claim 12, wherein the data is sequentially output by the third shift-register unit, the second shift-register unit and the first shift-register unit when the switching signal is at the second voltage level.

14. The bi-directional shift-register circuit as claimed in claim 11, further comprising a second switching circuit for selective output of the signal output from the second-stage output terminal to the third-stage first input terminal or third-stage second input terminal.

15. The bi-directional shift-register circuit as claimed in claim 11, wherein the first switching circuit comprises:
   a first transmission gate and a second transmission gate coupled to the first-stage output terminal and the third-stage output terminal and outputting the signal output from the first-stage output terminal to the second-stage first input terminal when the switching signal is at the first level; and
   a third transmission gate and a fourth transmission gate coupled to the first-stage output terminal and the third-stage output terminal and outputting the signal output from the third-stage output terminal to the second-stage second input terminal when the switching signal is at the first level.

16. The bi-directional shift-register circuit as claimed in claim 15, wherein the first transmission gate and the second transmission gate output the signal output from the third-stage output terminal to the second-stage first input terminal and the third transmission gate and the fourth transmission gate output the signal output from the first-stage output terminal to the second-stage second input terminal when the switching signal is at the second voltage level.

17. The bi-directional shift-register circuit as claimed in claim 15, wherein the first transmission gate, the second transmission gate, the third transmission gate and the fourth transmission gate comprise a PMOS transistor and a NMOS transistor, respectively.

18. The bi-directional shift-register circuit as claimed in claim 17, wherein the switching signal is coupled to the gates of the NMOS transistors of the first transmission gate and the fourth transmission gate and the gates of the PMOS transistors of the second transmission gate and the third transmission gate.

19. The bi-directional shift-register circuit as claimed in claim 17, wherein the inverted switching signal is coupled to the gates of the PMOS transistors of the first transmission gate and the fourth transmission gate and the gates of the NMOS transistors of the second transmission gate and the third transmission gate.

* * * * *

UNITED STATES PATENT AND TRADEMARK OFFICE
CERTIFICATE OF CORRECTION

PATENT NO. : 6,778,626 B2  Page 1 of 1
APPLICATION NO. : 10/406026
DATED : August 17, 2004
INVENTOR(S) : Jian-Shen Yu It is certified that error appears in the above-identified patent and that said Letters Patent is hereby corrected as shown below:

Title page,
Please insert item:
-- [30] Foreign Application Priority Data
   TW 91121269 filed on September 17, 2002--

Signed and Sealed this

Twenty-fifth Day of July, 2006

JON W. DUDAS
*Director of the United States Patent and Trademark Office*